(12) United States Patent
Kiwata et al.

(10) Patent No.: US 12,368,395 B2
(45) Date of Patent: Jul. 22, 2025

(54) VIBRATION POWER GENERATION DEVICE AND MOVING OBJECT

(71) Applicants: YAMAHA HATSUDOKI KABUSHIKI KAISHA, Iwata (JP); NATIONAL UNIVERSITY CORPORATION KANAZAWA UNIVERSITY, Kanazawa (JP)

(72) Inventors: Takahiro Kiwata, Ishikawa (JP); Toshiyuki Ueno, Ishikawa (JP); Kazuyuki Kitajima, Shizuoka (JP); Manabu Yamamoto, Shizuoka (JP)

(73) Assignees: YAMAHA HATSUDOKI KABUSHIKI KAISHA, Shizuoka (JP); NATIONAL UNIVERSITY CORPORATION KANAZAWA UNIVERSITY, Ishikawa (JP)

( * ) Notice: Subject to any disclaimer, the term of this patent is extended or adjusted under 35 U.S.C. 154(b) by 324 days.

(21) Appl. No.: 17/869,810

(22) Filed: Jul. 21, 2022

(65) Prior Publication Data
US 2023/0035833 A1     Feb. 2, 2023

(30) Foreign Application Priority Data
Jul. 27, 2021   (JP) .................................. 2021-122619

(51) Int. Cl.
*H02N 2/18*   (2006.01)
*H02K 35/04*   (2006.01)
(52) U.S. Cl.
CPC .................................. *H02N 2/186* (2013.01)
(58) Field of Classification Search
CPC .......... H02K 35/04; H02K 35/02; H02K 7/06; H02N 2/18

USPC ............................................................ 310/26
See application file for complete search history.

(56) References Cited

U.S. PATENT DOCUMENTS

| 10,367,434 | B2 | 7/2019 | Ahmad et al. |
| 2005/0230973 | A1* | 10/2005 | Fripp ..................... H02K 35/04 |
| | | | 290/1 R |
| 2005/0230974 | A1 | 10/2005 | Masters et al. |

(Continued)

FOREIGN PATENT DOCUMENTS

| CN | 106385200 B | 5/2018 |
| JP | 2013-208026 A | 10/2013 |

(Continued)

OTHER PUBLICATIONS

Wang, X.K. et al., "Vortex-induced vibrations of a neutrally buoyant circular cylinder near a plane wall", Journal of Fluids and Structures, vol. 39, May 2013, pp. 188-204.

(Continued)

*Primary Examiner* — Jose A Gonzalez Quinones
(74) *Attorney, Agent, or Firm* — Keating & Bennett, LLP

(57) ABSTRACT

A vibration power generation device that further improves power generation efficiency includes a vibration exciting body in which vibration is caused by a flowing fluid, a vibrated body that is oscillatable and connected to the vibration exciting body, and a power generator to generate electricity by oscillation of the vibrated body. The vibration exciting body is in proximity to a wall surface, and vibration is caused in the vibration exciting body by a fluid flowing along the wall surface.

25 Claims, 15 Drawing Sheets

(56) References Cited

U.S. PATENT DOCUMENTS

| | | | |
|---|---|---|---|
| 2012/0086310 A1* | 4/2012 | Allaei | H10N 30/304 |
| | | | 310/339 |
| 2013/0140919 A1 | 6/2013 | Ueno et al. | |
| 2015/0180376 A1 | 6/2015 | Becker et al. | |
| 2017/0237369 A1 | 8/2017 | Becker et al. | |

FOREIGN PATENT DOCUMENTS

| | | | | |
|---|---|---|---|---|
| KR | 20200110486 A * | 9/2020 | | |
| WO | WO-2007071975 A1 * | 6/2007 | ......... | E21B 41/0085 |
| WO | 2011/158473 A1 | 12/2011 | | |

OTHER PUBLICATIONS

Meng-Hsuan Chung, "Transverse vortex-induced vibration of spring-supported circular cylinder translating near a plane wall", European Journal of Mechanics B/Fluids, vol. 55, 2016, pp. 88-103.

Extended European Search Report in EP22187202.1, mailed Feb. 17, 2023, 8 pages.

* cited by examiner

VIBRATION POWER GENERATION DEVICE AND MOVING OBJECT

CROSS REFERENCE TO RELATED APPLICATIONS

This application claims the benefit of priority to Japanese Patent Application No. 2021-122619, filed Jul. 27, 2021. The entire contents of this application are hereby incorporated herein by reference.

BACKGROUND OF THE INVENTION

1. Field of the Invention

The present invention relates to a vibration power generation device and a moving object.

2. Description of the Related Art

In recent years, various vibration power generation devices that generate power by electromagnetic induction or piezoelectric phenomenon using vibration have been developed. For example, a vibration power generation device has been proposed in which a weight is installed at the end of a magnetostrictive rod wound with a coil, and the vibration of the weight causes the magnetostrictive rod to vibrate, and partially expand and contract, generating electricity through the reverse magnetostriction effect (for example, see International Publication WO 2011/158473).

As a method of vibrating a weight in such a vibration power generation device, it is conceivable to place the weight in a fluid to generate a Karman vortex to cause self-excitation vibration of the weight. In this case, when the vibration frequency of the weight caused by the Karman vortex (vortex shedding frequency) matches the natural frequency of the vibration system consisting of the weight and magnetostrictive rod, a lock-in phenomenon occurs and the weight vibrates significantly, thus improving the power generation efficiency of the vibration power generation device.

However, it is known that, for example, if the weight is cylindrical, the Strouhal number is almost constant, and as the fluid flow velocity changes, the vortex shedding frequency also changes. As a result, it is difficult to maintain a state in which the vortex shedding frequency matches the natural frequency of the vibration system consisting of weights and magnetostrictive rods, and the power generation efficiency of the vibration power generation device may decrease. Therefore, the conventional vibration power generation devices still have room for improvement in terms of power generation efficiency.

SUMMARY OF THE INVENTION

Preferred embodiments of the present invention improve power generation efficiency of vibration power generation devices.

According to a preferred embodiment of the present invention, a vibration power generation device includes a vibration exciting body in which vibration is caused by a flowing fluid, a vibrated body which is oscillatable and is connected to the vibration exciting body, and a power generator to generate electricity by oscillation of the vibrated body, wherein the vibration exciting body is located in proximity to a wall surface, and vibration is caused in the vibration exciting body by a fluid flowing along the wall surface.

According to the above configuration, the vibration exciting body is located in proximity to the wall surface, which aids the vibration of the vibration exciting body, thus increasing the vibration of the vibration exciting body even outside of a flow velocity range where lock-in phenomenon is associated. That is, even if the vortex shedding frequency of the vibration exciting body does not match the natural frequency of the vibration system including the vibration exciting body and the vibrated body, the vibration exciting body is able to be sufficiently vibrated and further improve the power generation efficiency.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to the drawings.

Figure 1A:
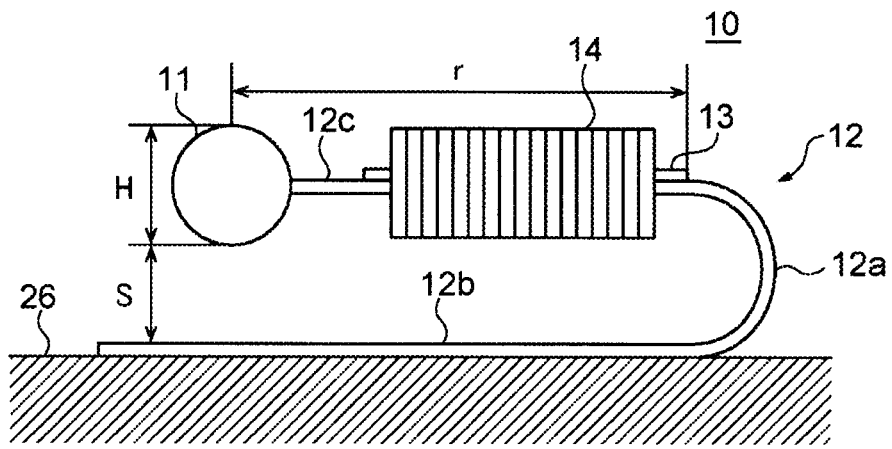
FIGS. 1A to 1C illustrate a vibration power generation device according to a preferred embodiment of the present invention.
Figure 1B:
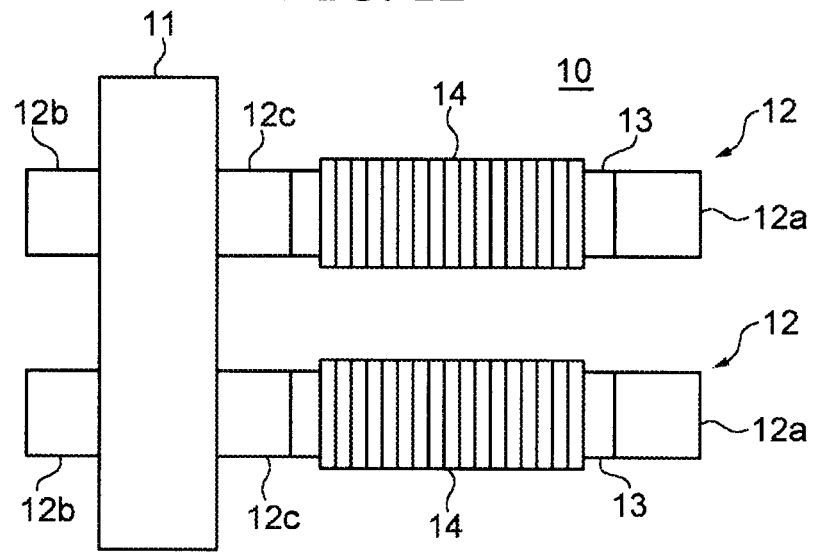
Figure 1C:
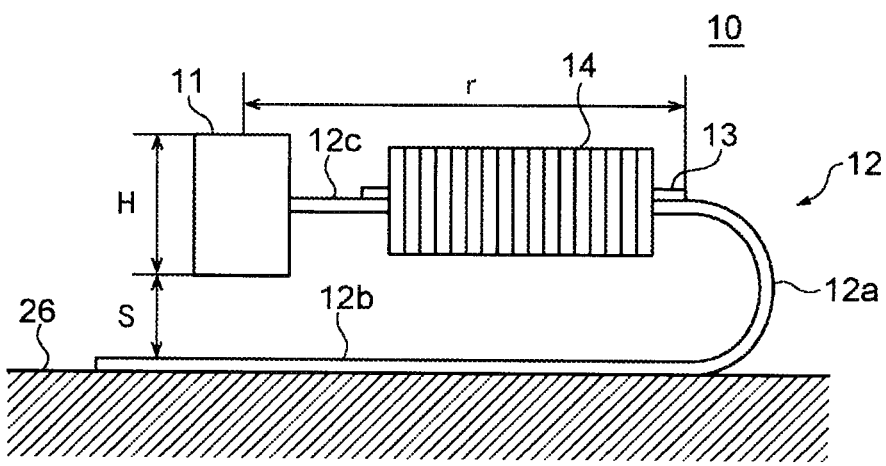

FIGS. 1A to 1C illustrate a vibration power generation device according to a preferred embodiment of the present invention. FIG. 1A is a side view of the vibration power generation device, FIG. 1B is a plan view of the vibration power generation device, and FIG. 1C is a side view of a modification of the vibration power generation device.

In FIGS. 1A and 1B, a vibration power generation device 10 includes a vibration exciting body 11, which may be an elongated weight, and two long plate-shaped frames 12 connected at one end to the vibration exciting body 11. The frames 12 are disposed parallel or substantially parallel to each other in a plan view. A bar-shaped magnetostrictive plate 13 is attached to each of the frames 12, and a coil 14 is wound around the frame 12 and the magnetostrictive plate 13. The magnetostrictive plate 13 and the coil 14 define a power generator.

The frames 12 are made of a magnetic material, for example, carbon steel (for example, SS400 material, SC material, or SK material) or ferritic stainless steel (for example, SUS430). The frames 12 are U-shaped in a lateral view. In the frames 12, the portions facing each other through a bend 12a define a base 12b and an arm 12c (vibrated body), respectively. The base 12b is attached and fixed to a structure or a moving object. In a preferred embodiment of the present invention, the structure or moving object to which the base 12b is attached does not actively vibrate. The vibration exciting body 11 is attached to the end of the arm 12c. Furthermore, the magnetostrictive plate 13 and the coil 14 described above are attached to the arm 12c between the vibration exciting body 11 and the bend 12a of the frame 12, but the arm 12c is not fixed to the structure or moving object. Thus, in the frame 12, the arm 12c functions as a cantilever beam with the bend 12a side as the fixed end and the vibration exciting body 11 side as the free end. Therefore, when the vibration exciting body 11 vibrates in the vertical direction in FIG. 1A, the arm 12c oscillates in the vertical direction in FIG. 1A around the fixed end due to the vibration of the vibration exciting body 11. The frames 12 may be, for example, channel-shaped or V-shaped in a lateral view.

The magnetostrictive plate 13 is preferably made of a ductile magnetostrictive material, and is made of, for example, an iron-gallium alloy, an iron-cobalt alloy, an Fe—Al alloy, or an Fe—Si—B alloy. Furthermore, a magnetostrictive material to which compressive stress has been applied by subjecting it to stress annealing treatment in advance may be used as the material of the magnetostrictive plate 13. The magnetostrictive material of the magnetostrictive plate 13 may be in an amorphous state as well as in a crystalline state. The magnetostrictive plate 13 is attached to the outer surface of the arm 12c (the upper surface of the arm 12c in FIG. 1A) by, for example, soldering, waxing, resistance welding, laser welding, or ultrasonic bonding.

The material of the vibration exciting body 11 is not particularly limited, and is preferably a high specific gravity material such as ANVILOY, in order to vibrate the vibration exciting body 11 at low flow velocities. The vibration exciting body 11 is preferably a cylindrical member in this case, however, the vibration exciting body 11 may be an elongated member to which a plurality of the frames 12 are attached, for example, a rectangular columnar member (FIG. 1C).

Figure 2A:
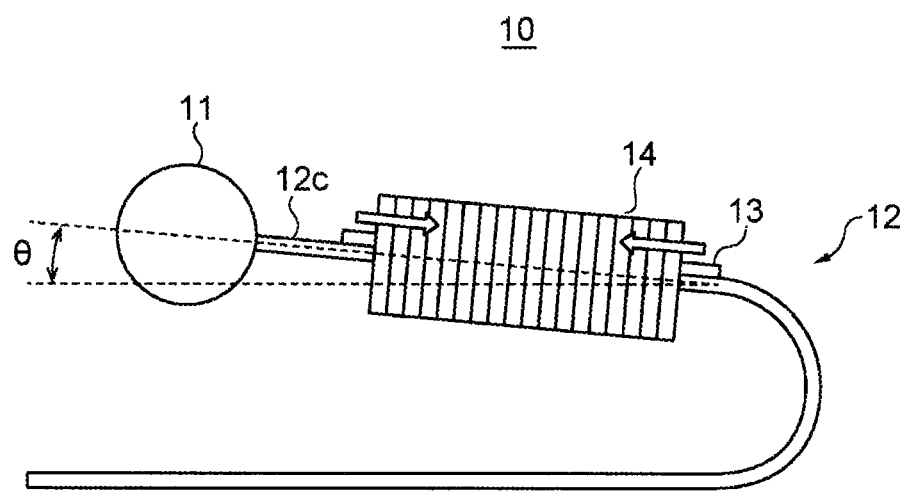
FIGS. 2A and 2B are side views to illustrate power generation by the vibration power generation device of FIGS. 1A to 1C.
Figure 2B:
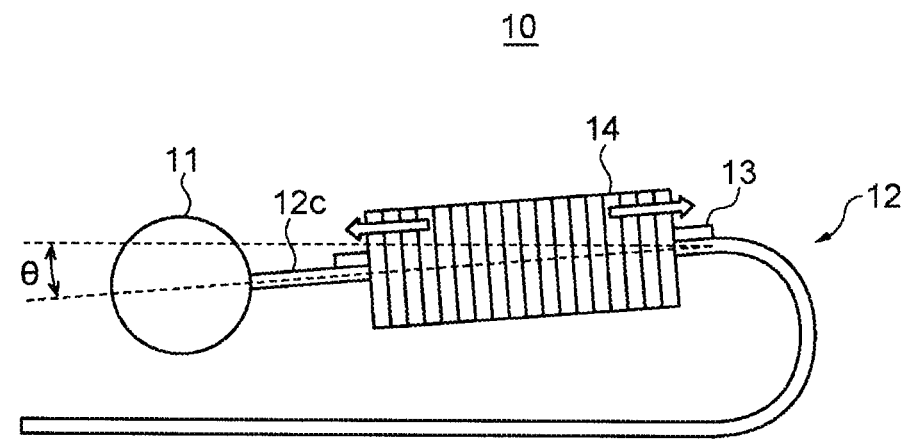

FIGS. 2A and 2B are side views to illustrate power generation by the vibration power generation device 10 of FIGS. 1A to 1C. In FIGS. 2A and 2B, the vibration exciting body 11 vibrates in the vertical direction in the figure. As illustrated in FIG. 2A, when the vibration exciting body 11 moves upward, the arm 12c warps upward and the magnetostrictive plate 13 attached to the upper surface of the arm 12c is compressed in the longitudinal direction of the arm 12c (see the arrows in the figure). As illustrated in FIG. 2B, when the vibration exciting body 11 moves downward, the arm 12c warps downward and the magnetostrictive plate 13 attached to the upper surface of the arm 12c is extended in the longitudinal direction of the arm 12c (see the arrows in the figure). That is, when the vibration exciting body 11 vibrates in the vertical direction, the extension and compression of the magnetostrictive plate 13 is repeated. At this time, since compressive and tensile stresses act alternately on the magnetostrictive plate 13, changes in the magnetic flux flowing through the plate 13 are repeated due to the reverse magnetostriction effect. This causes a continuous change in the magnetic flux through the coil 14, which generates an electromotive force in the coil 14 to generate electricity.

Various methods are possible to vibrate the vibration exciting body 11 in the vertical direction. An example of a possible method is to place the vibration exciting body 11 in a fluid to create a Karman vortex downstream, causing the vibration exciting body 11 to vibrate vortically (vortex induced vibration). However, it is not known what fluid vibration phenomena occur in the vibration exciting body 11 when the vibration exciting body 11 is disposed in proximity to a wall surface of a structure or the like in a fluid. On the other hand, it is known that various fluidic effects may be obtained when an object is brought into close proximity to a wall surface or the like to narrow the flow path between the object and the wall surface.

Therefore, the inventors of preferred embodiments of the present invention conducted experiments using a circulating water tank to determine what fluid vibration phenomena occur in the vibration exciting body 11 when the vibration exciting body 11 is disposed in proximity to a wall surface in a fluid.

Figure 3:
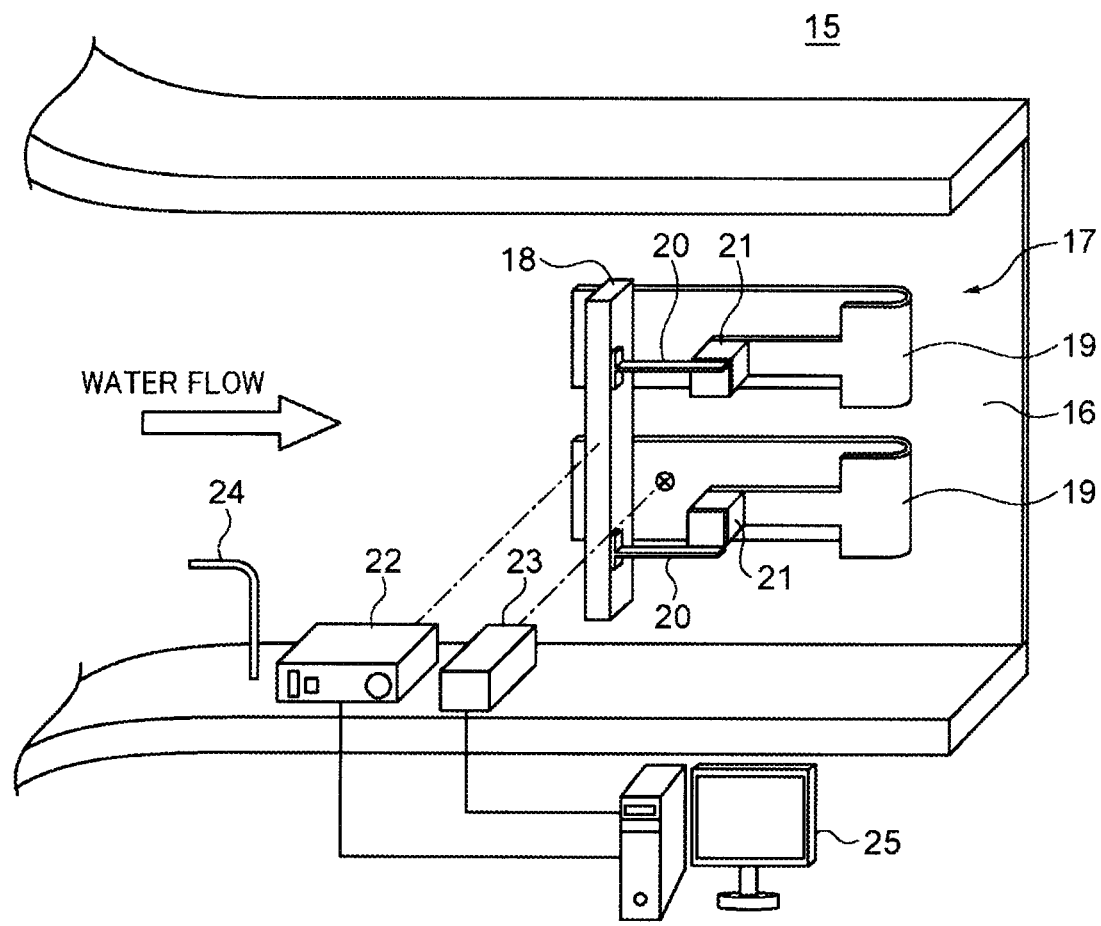
FIG. 3 shows a schematic drawing of a circulating water tank used in an experiment to observe fluid vibration phenomena that occur when the vibration exciting body of a vibration power generation device is disposed in proximity to a wall surface.

FIG. 3 illustrates a schematic drawing of a circulating water tank used in an experiment to observe the fluid vibration phenomena that occur when the vibration exciting body 11 of the vibration power generation device 10 is disposed in proximity to a wall surface. In FIG. 3, a vibration experimental device 17 that imitates the vibration power generation device 10 was fixed to a flat wall surface 16 of a circulating water tank 15 where a uniform water flow was occurring, as indicated by the arrow in the figure. The vibration experimental device 17 has a columnar body 18 that imitates the vibration exciting body 11, and two U-shaped frames 19 that imitate the frames 12. In the vibration experimental device 17, each of the U-shaped frames 19 is not directly attached to the columnar body 18. Two arms 20 were attached to the columnar body 18, and a block-shaped height adjustment jig 21 was sandwiched between each of the arms 20 and the U-shaped frames 19. The vibration experimental device 17 was disposed in the circulating water tank 15 so that the longitudinal direction of the columnar body 18 was perpendicular or substantially perpendicular to the water flow, the columnar body 18 was parallel or substantially parallel to the wall surface 16, and the longitudinal direction of each U-shaped frame 19 was parallel or substantially parallel to the water flow. Since the purpose of this experiment was to observe fluid vibration phenomena, the vibration experimental device 17 was not provided with components equivalent to the magnetostrictive plate 13 and the coil 14. Furthermore, since the wall surface 16 of the circulating water tank 15 did not vibrate, the vibration in the columnar body 18 was not caused by the vibration of the wall surface 16, but only by the action of the fluid, such as the generation of vortices.

In the experiment, a plurality of the height adjustment jigs 21 of different heights were prepared, and the distance S between the columnar body 18 and the wall surface 16 was changed by replacing the height adjustment jigs 21. In addition, a cylindrical member (sample 1) and three types of rectangular columnar members (samples 2 to 4) having cross sectional aspect ratios that differ from one another were prepared as the columnar body 18. For each of the samples 1 to 4, vibrations occurring in the vibration experimental device 17 were observed when the distance S between the columnar body 18 and the wall surface 16 was changed. The samples 1 and 4 were made of stainless steel, while the samples 2 and 3 were made of ANVILOY.

The circulating water tank 15 includes a laser displacement meter 22, a laser Doppler velocimeter (LDV) 23, and a pitot tube 24. The laser displacement meter 22 measured the vibratory displacement of the columnar body 18 relative to the wall surface 16, the LDV 23 measured the velocity variation of the water flow behind the columnar body 18, and the pitot tube 24 measured the velocity U of the water relative to the wall surface 16. Furthermore, a computer 25 compiled the measurement results of the laser displacement meter 22, the LDV 23, and the pitot tube 24 to calculate the angle of deviation θ of the vibration in the columnar body 18, vortex shedding frequency $f_w$, and reduced velocity $V_r$ to be described below.

Experiment 1

Figure 4A:
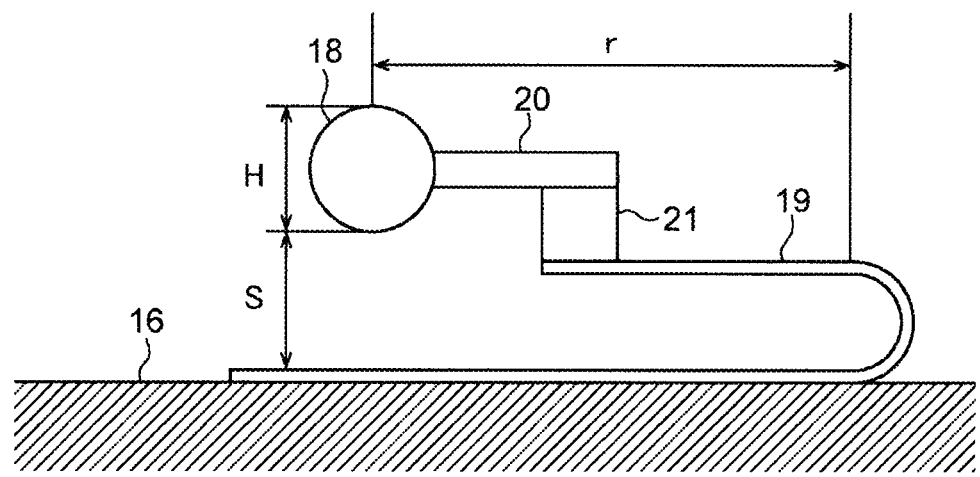
FIGS. 4A and 4B illustrate the observation results of fluid vibration phenomena when a cylindrical member is used as a columnar body.

First, as illustrated in FIG. 4A, a cylindrical member as the sample 1 was used as the columnar body 18. The longitudinal length of the columnar body 18 was 200 mm. The cross-sectional shape of the columnar body 18, parallel to the direction of water flow and perpendicular to the wall surface 16, was circular, and the diameter H of the circular shape was 20 mm. The total length r (see FIG. 4A) of the vibration system (hereinafter referred to as the "experimental vibration system"), which includes the columnar body 18, the arm of the U-shaped frame 19, the height adjustment jig 21, and the arm 20, was 142 mm.

In Experiment 1, the water velocity U was varied in the range of 0.4 m/s to 2.6 m/s, and the gap S between the wall surface 16 and the columnar body 18 was varied in steps to observe the vibration occurring in the columnar body 18. Specifically, the gap spacing ratio S/H was varied in four steps of 0.5, 1.0, 2.0, and 3.0. The observation results of the vibration are illustrated in the graph in FIG. 4B. Here, when a waveform vibration with an angle of vibration θ of 0.05 deg or more was observed, it was judged that vibration was occurring in the columnar body 18.

Figure 4B:
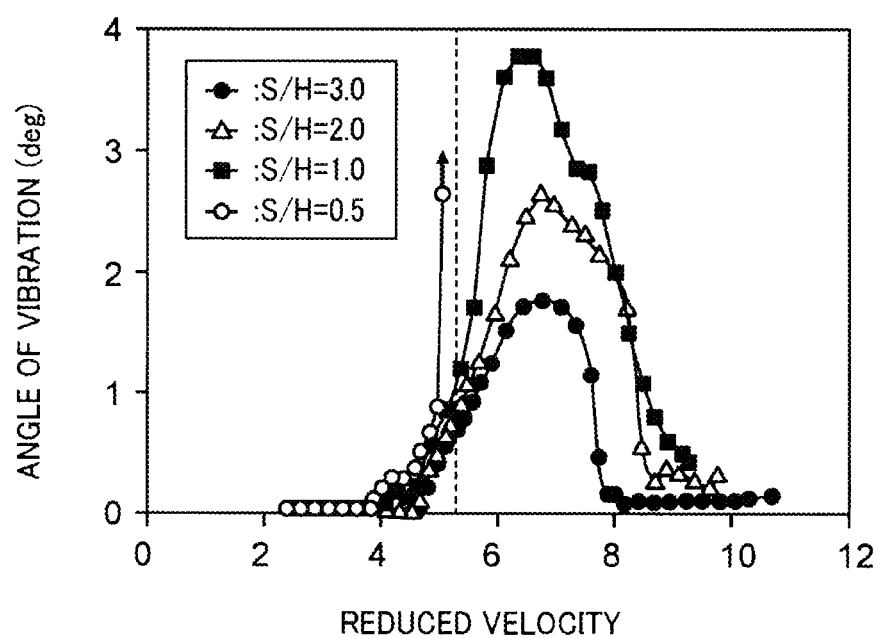

The horizontal axis of the graph in FIG. 4B is the reduced velocity Vr, and the vertical axis is the angle of vibration θ of the experimental vibration system (see FIGS. 2A and 2B). The reduced velocity Vr is the dimensionless velocity of water corrected for the effect of the blockage of water flowing between the wall surface 16 and the columnar body 18. When the natural frequency of the experimental vibration system is fc, the reduced velocity Vr is expressed by the following equation (1):

$$Vr = U/(fc \times H) \quad (1)$$

In addition, the resonant reduced velocity was calculated from the vortex shedding frequency $f_w$ when no vibration occurred in the columnar body 18 at a gap spacing ratio S/H=3.0, and a resonant reduced velocity value of approximately 5.3 was obtained. Vortex induced vibration is expected to increase the vibration of the columnar body 18 near the resonant reduced velocity, and the resonant reduced velocity is indicated by the dashed line in the graph in FIG. 4B.

As a result of the observation, as illustrated in the graph in FIG. 4B, for any gap spacing ratio S/H, vibration occurred in the columnar body 18 from the reduced velocity Vr≈4.0, which is near the resonant reduced velocity, indicating that vibration is caused mainly by vortex induced vibration in the case of the cylindrical member.

At a gap spacing ratio S/H=0.5, the experiment was stopped because the angle of vibration θ increased rapidly when the reduced velocity Vr exceeded 5.0 or so and the columnar body 18 collided with the wall surface 16. At a gap spacing ratio S/H=1.0, the angle of vibration θ increased until the reduced velocity Vr reached 6.5, after which the angle of vibration θ decreased, but the columnar body 18 was still vibrating even when the reduced velocity Vr was above 8.0. At a gap spacing ratio S/H=2.0, the angle of vibration θ increased until the reduced velocity Vr reached 6.8, after which the angle of vibration θ decreased, but the columnar body 18 was still vibrating even when the reduced velocity Vr was above 8.0. At a gap spacing ratio S/H=3.0, the angle of vibration θ increased until the reduced velocity Vr reached 6.8, after which the angle of vibration θ decreased, but the columnar body 18 was still vibrating until the reduced velocity Vr reached 8.0.

As can be seen from the graph in FIG. 4B, the smaller the gap spacing ratio S/H, the larger the angle of vibration θ becomes and the wider the range of reduced velocity Vr over which vibration occurs in the columnar body 18. This is considered to be because the closer the columnar body 18, which is a cylindrical member, is to the wall surface 16, the larger the gap variation ratio, which is the ratio of the difference between the maximum gap Smax and the minimum gap Smin to the maximum gap Smax as expressed by the following equation (2), and thus the pressure variation of the water flow acting on the columnar body 18 also becomes larger, which contributes to vibration.

$$\text{Gap variation ratio} = (Smax - Smin)/Smax \quad (2)$$

The maximum gap Smax is the gap S when the columnar body 18 is farthest from the wall surface 16, and the minimum gap Smin is the gap S when the columnar body 18 is closest to the wall surface 16.

Experiment 2

Figure 5A:
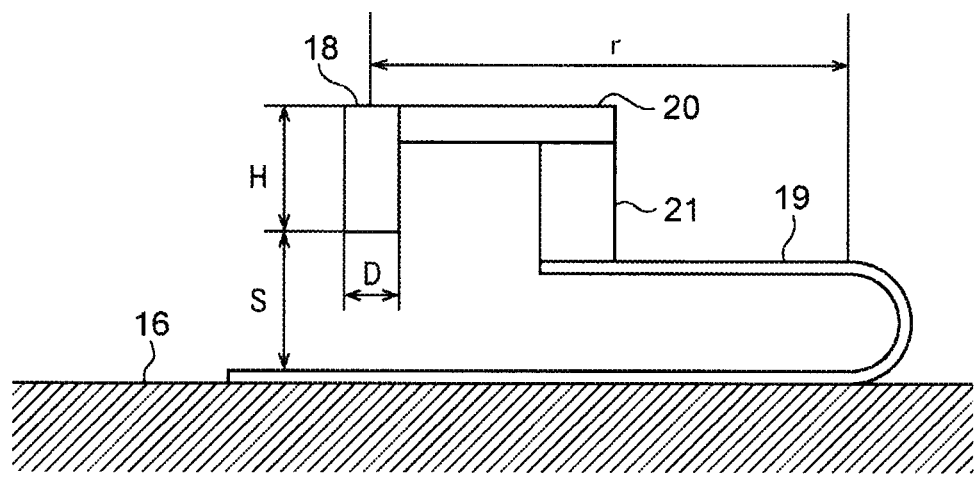
FIGS. 5A and 5B illustrate the observation results of fluid vibration phenomena when a rectangular columnar member is used as a columnar body.

Next, as illustrated in FIG. 5A, a rectangular columnar member as the sample 2 was used as the columnar body 18. The longitudinal length of the columnar body 18 was 200 mm. The cross-sectional shape of the columnar body 18, parallel to the direction of water flow and perpendicular to the wall surface 16, was rectangular. Referring to FIG. 5A, the length H of the columnar body 18 in the direction perpendicular to the wall surface 16 was 20 mm, and the length D in the direction parallel to the direction of water flow was 4 mm. That is, the aspect ratio D/H of the columnar body 18 was set to 0.2. The total length r of the experimental vibration system was 172 mm.

In Experiment 2, as in Experiment 1, the water velocity U was varied in the range of 0.4 m/s to 2.6 m/s, and the gap spacing ratio S/H was varied in four steps of 0.5, 1.0, 2.0, and 3.0, and the vibration occurring in the columnar body 18 was observed. Also in Experiment 2, when a waveform vibration with an angle of vibration θ of 0.05 deg or more was observed, it was determined that the columnar body 18 was vibrating.

Figure 5B:
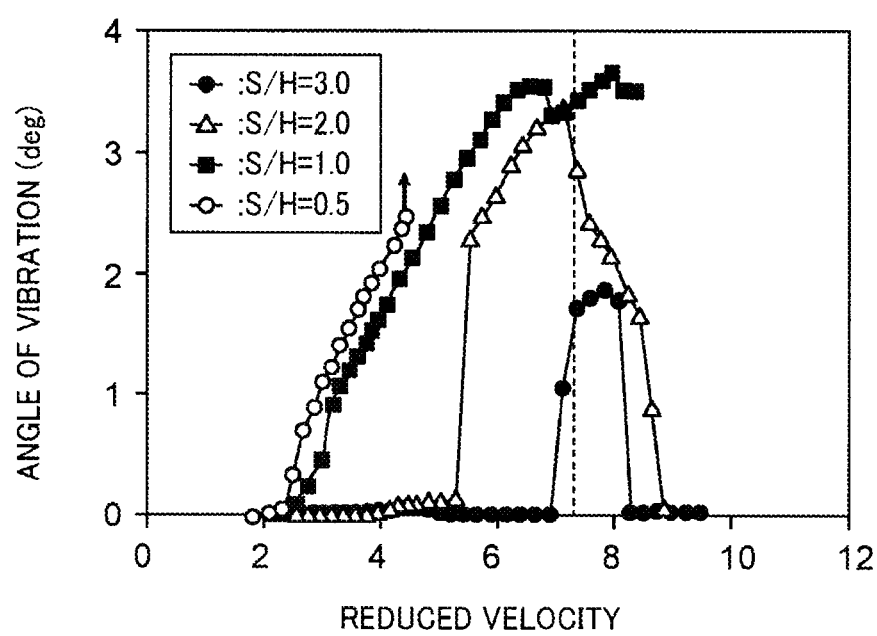

FIG. 5B is a graph illustrating the observation results of vibration of the columnar body 18 when the aspect ratio D/H of the columnar body 18 is 0.2. The description of the vertical and horizontal axes in FIG. 5B is the same as that of the vertical and horizontal axes of the graph in FIG. 4B. The resonant reduced velocity in Experiment 2 is approximately 7.3, which is indicated by the dashed line in the graph in FIG. 5B.

As illustrated in the graph in FIG. 5B, at a gap spacing ratio S/H=0.5, vibration occurred in the columnar body 18 when the reduced velocity Vr exceeded 2.0, and then the angle of vibration θ increased rapidly and the columnar body 18 collided with the wall surface 16, so the experiment was stopped. At a gap spacing ratio S/H=1.0, vibration occurred in the columnar body 18 when the reduced velocity Vr exceeded 2.0, then the angle of vibration θ increased rapidly until the reduced velocity Vr reached 6.8, and then the angle of vibration θ was almost maintained until the reduced velocity Vr reached 8.5. At a gap spacing ratio S/H=2.0, vibration occurred in the columnar body 18 when the reduced velocity Vr exceeded 2.0, then the angle of vibration θ increased rapidly after when the reduced velocity Vr exceeded 5.0, then the angle of vibration θ decreased when the reduced velocity Vr exceeded 7.0, and no vibration occurred in the columnar body 18 when the reduced velocity Vr exceeded 9.0. Also at a gap spacing ratio S/H=3.0, vibration occurred in the columnar body 18 when the reduced velocity Vr exceeded 2.0, then the angle of vibration θ increased rapidly when the reduced velocity Vr exceeded 7.0, and then the angle of vibration θ decreased rapidly when the reduced velocity Vr exceeded 8.0, and no vibration occurred in the columnar body 18 when the reduced velocity Vr exceeded 9.5.

As can be seen from the graph in FIG. 5B, in Experiment 2, except for the case where the gap spacing ratio S/H=3.0, large vibration occurred in the columnar body 18 from the point when the reduced velocity Vr was much lower than the resonant reduced velocity. This is considered to be because the closer the columnar body 18, which was a rectangular columnar member, was to the wall surface 16, the larger the above-described gap variation ratio between the wall surface 16 and the columnar body 18 becomes, resulting in larger fluctuations in the pressure of the water flow acting on the columnar body 18, which in turn facilitated the generation of low-speed galloping vibrations. The absence of low-speed galloping vibration when the gap spacing ratio S/H=3.0, where the columnar body 18 is disposed relatively far from the wall surface 16, was considered to support this consideration.

Experiment 3

Next, a rectangular columnar member as the sample 3 was used as the columnar body 18. The longitudinal length of the columnar body 18 was 200 mm. The cross-sectional shape of the columnar body 18, parallel to the direction of water flow and perpendicular to the wall surface 16, was rectangular. Referring to FIG. 5A, the length H of the columnar body 18 was 20 mm and the length D was 10 mm. That is, the aspect ratio D/H of the columnar body 18 was set to 0.5. The total length r of the experimental vibration system was 142 mm.

In Experiment 3, as in Experiment 1, the water velocity U was varied in the range of 0.4 m/s to 2.6 m/s, and the gap spacing ratio S/H was varied in four steps of 0.5, 1.0, 2.0, and 3.0, and the vibration occurring in the columnar body 18 was observed. Also in Experiment 3, when a waveform vibration with an angle of vibration θ of 0.05 deg or more was observed, it was determined that the columnar body 18 was vibrating.

Figure 6A:
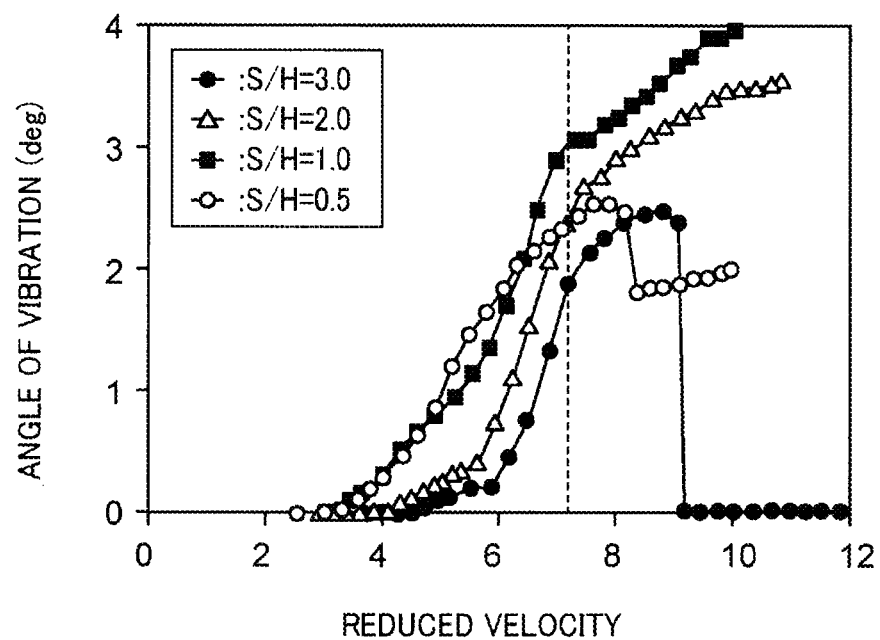
FIGS. 6A and 6B illustrate the observation results of fluid vibration phenomena when a rectangular columnar member is used as a columnar body.

FIG. 6A is a graph illustrating the observation results of vibration of the columnar body 18 when the aspect ratio D/H of the columnar body 18 is 0.5. The description of the vertical and horizontal axes in FIG. 6A is the same as that of the vertical and horizontal axes of the graph in FIG. 4B. The resonant reduced velocity in Experiment 3 was approximately 7.2, which is indicated by the dashed line in the graph in FIG. 6A.

As illustrated in the graph in FIG. 6A, when the gap spacing ratio S/H=0.5, vibration occurred in the columnar body 18 when the reduced velocity Vr exceeded 3.0, and when the reduced velocity Vr exceeded 8.0, the angle of vibration θ decreased once, after which the angle of vibration θ increased slightly, without decreasing significantly, until the reduced velocity Vr reached 10.0. At a gap spacing ratio S/H=1.0, vibration occurred in the columnar body 18 when the reduced velocity Vr exceeded 3.0, and then the angle of vibration θ increased until the reduced velocity Vr reached 10. At a gap spacing ratio S/H=2.0, vibration occurred in the columnar body 18 when the reduced velocity Vr exceeded 4.0, and then the angle of vibration θ increased until the reduced velocity Vr reached 11.0. Also at a gap spacing ratio S/H=3.0, vibration occurred in the columnar body 18 when the reduced velocity Vr exceeded 4.0, then the angle of vibration θ increased until the reduced velocity Vr reached 9.0, and then the angle of vibration θ decreased rapidly when the reduced velocity Vr exceeded 9.0.

As can be seen from the graph in FIG. 6A, in Experiment 3, vibrations occurred in the columnar body 18 from a reduced velocity Vr much lower than the resonant reduced velocity for all gap spacing ratios. As in Experiment 2, this is considered to be due to the proximity of the columnar body 18, which is a rectangular columnar member, to the wall surface 16, which facilitated the generation of low-speed galloping vibration. As illustrated in the graph of FIG. 6A, the smaller the gap spacing ratio S/H, i.e., the closer the columnar body 18 is to the wall surface 16, the lower the region of the reduced velocity Vr from which low-speed galloping vibration is excited, which supports this consideration. At the gap spacing ratio S/H=1.0 and S/H=2.0, the angle of vibration θ did not decrease even after the reduced velocity Vr exceeded the resonant reduced velocity. This is considered to be due to the occurrence of high-speed galloping vibrations when the reduced velocity Vr exceeds the vicinity of the resonant reduced velocity where vortex induced vibration becomes dominant.

Experiment 4

Next, a rectangular columnar member as the sample 4 was used as the columnar body 18. The longitudinal length of the columnar body 18 was 200 mm. The cross-sectional shape of the columnar body 18, parallel to the direction of the water flow and perpendicular to the wall surface 16, was square. That is, both the length H and length D of the columnar body 18 illustrated in FIG. 5A are 20 mm, and the aspect ratio D/H of columnar body 18 was set to 1.0. The total length r of the experimental vibration system was 142 mm.

In Experiment 4, as in Experiment 1, the water velocity U was varied in the range of 0.4 m/s to 2.6 m/s, and the gap spacing ratio S/H was varied in four steps of 0.5, 1.0, 2.0, and 3.0, and the vibration occurring in the columnar body 18 was observed. Also in Experiment 4, when a waveform vibration with an angle of vibration θ of 0.05 deg or more was observed, it was determined that the columnar body 18 was vibrating.

Figure 6B:
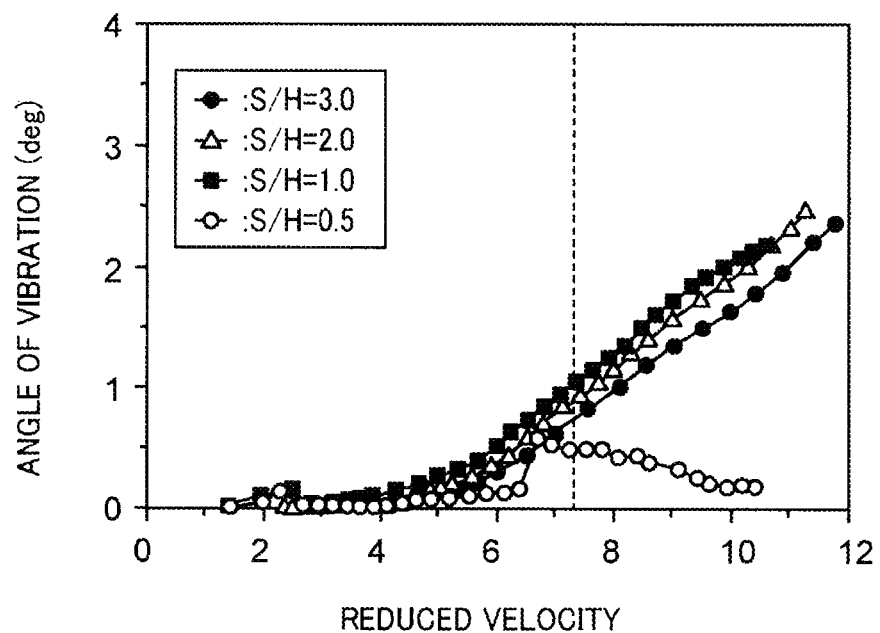

FIG. 6B is a graph illustrating the observation results of vibration of the columnar body 18 when the aspect ratio D/H of the columnar body 18 is 1.0. The description of the vertical and horizontal axes in FIG. 6B is the same as that of the vertical and horizontal axes of the graph in FIG. 4B. The resonant reduced velocity in Experiment 4 was approximately 7.3, which is indicated by the dashed line in the graph in FIG. 6B.

As illustrated in the graph in FIG. 6B, when the gap spacing ratio S/H=0.5, although vibration occurred in the columnar body 18 when the reduced velocity Vr exceeded 4.0, the angle of vibration θ did not increase until the reduced velocity Vr exceeded 6.4, and although the angle of vibration θ increased somewhat near the resonant reduced velocity, the angle of vibration θ decreased thereafter as the reduced velocity Vr increased. On the other hand, in any case of gap spacing ratios S/H=1.0, 2.0, and 3.0, vibration occurred in the columnar body 18 when the reduced velocity Vr exceeded 4.0, and then the angle of vibration θ increased even when the reduced velocity Vr exceeded 10.

As can be seen from the graph in FIG. 6B, also in Experiment 4, low-speed galloping vibration was excited by the proximity of the columnar body 18, which is a rectangular columnar member, to the wall surface 16 at all gap spacing ratios. At the gap spacing ratio S/H=0.5 in Experiment 4, the angle of vibration θ decreased after the reduced velocity Vr exceeded the resonant reduced velocity, and the similar tendency was observed at the gap spacing ratio S/H=0.5 in Experiment 3, while at the gap spacing ratios S/H=1.0, 2.0, and 3.0 in Experiment 4, the angle of vibration θ increased after the reduced velocity Vr exceeded the resonant reduced velocity, and a similar tendency was observed at the gap spacing ratios S/H=1.0 and 2.0 in Experiment 3. This also indicates that excessive proximity of the columnar body 18 to the wall surface 16 is not desirable to generate high-speed galloping vibrations.

The observation results from Experiments 1 to 4 yielded the following findings. By disposing the columnar body 18 in a water flow in proximity to the wall surface 16, the gap variation ratio increases, and the pressure variation of the water flow acting on the columnar body 18 also increases. Therefore, not only vortex induced vibration occurring near the resonant reduced velocity, but also low-speed galloping vibration are generated at low reduced velocities. In addition, under some conditions, high velocity galloping vibration is generated even when the reduced velocity exceeds the resonant reduced velocity. As a result, the vibration of the columnar body 18 is able to be maintained even when the water velocity changes.

Applying this finding to the vibration power generation device 10, in a preferred embodiment of the present invention, the vibration exciting body 11 is disposed in proximity to a wall surface 26 of the structure or moving object to which the base 12b of the frame 12 is attached, in the flow of a fluid such as gas or water. In particular, based on the observation results of Experiments 1 to 4, (here, the distance between the wall surface 26 and the vibration exciting body 11 is a gap S, and the length of the vibration exciting body 11 in the direction perpendicular to the wall surface 26 is a length H), by setting the gap spacing ratio S/H to 3.0 or less, the gap variation ratio increases and the pressure variation of the fluid acting on the columnar body 18 also increases, which allows low-speed galloping vibrations to be generated at low reduced velocities, and thus the vibration of the vibration exciting body 11 is able to be maintained even when the fluid flow velocity changes. As a result, the power generation efficiency of the vibration power generation device 10 is further improved.

More specifically, in a preferred embodiment of the present invention, when the cross-sectional shape of the vibration exciting body 11 parallel to the fluid flow direction and perpendicular to the wall surface is circular, as indicated in the observation results of Experiment 1, keeping the reduced velocity Vr of the fluid 4.0 or more generates vibration in the vibration exciting body 11 and further improves the power generation efficiency of the vibration power generation device 10.

When the cross-sectional shape of the vibration exciting body 11 parallel to the fluid flow direction and perpendicular to the wall surface is rectangular and the aspect ratio D/H of the cross-sectional shape is 0.2, as indicated in the observation results of Experiment 2, keeping the reduced velocity Vr of the fluid 2.0 or more generates vibration in the vibration exciting body 11 and further improves the power generation efficiency of the vibration power generation device 10.

Furthermore, when the cross-sectional shape of the vibration exciting body 11 is rectangular and the aspect ratio D/H of the cross-sectional shape is 0.5, as indicated in the observation results of Experiment 3, keeping the reduced velocity Vr of the fluid 3.0 or more generates vibration in the vibration exciting body 11 and further improves the power generation efficiency of the vibration power generation device 10.

When the cross-sectional shape of the vibration exciting body 11 is rectangular and the aspect ratio D/H of the cross-sectional shape is 1.0, as indicated in the observation results of Experiment 4, keeping the reduced velocity Vr of the fluid 4.0 or more generates vibration in the vibration exciting body 11 and further improves the power generation efficiency of the vibration power generation device 10.

Since the present preferred embodiment is based on the findings of Experiments 1 to 4, which were conducted using the columnar bodies 18 with an aspect ratio D/H of 1.0 or less, the aspect ratio D/H of the vibration exciting body 11 is also preferably 1.0 or less (D/H≤1.0). Since the present preferred embodiment is based on the findings of Experiments 1 to 4, in which the wall surface 16 of the circulating water tank 15 do not vibrate, it is assumed that the wall surface of the structure or moving object to which the base 12b of the frame 12 is attached do not vibrate.

According to a preferred embodiment of the present invention, as described above, by disposing the vibration exciting body 11 in proximity to the wall surface, low-speed galloping vibration is able to be generated at a low reduced velocity Vr, which allows the vibration exciting body 11 to vibrate even in a large vibration power generation device 10, where the natural frequency is lower. As a result, the use of a large vibration power generation device 10 further improves power generation efficiency due to the synergistic effect of the larger size of the vibration power generation device 10 and the expanded range of reduced velocities at which the vibration exciting body 11 vibrates.

In a preferred embodiment of the present invention, the vibration power generation device 10 includes two frames 12, but the number of the frames 12 is not limited to two, but may be one, three, or more. When the number of the frames 12 is three or more, the power generation efficiency is improved by providing the magnetostrictive plate 13 and the coil 14 on each of the frames 12.

Preferred embodiments of the present invention have been described above, but the invention is not limited to the above-described preferred embodiments, and various variations and changes are possible within the scope of the gist thereof.

For example, in the vibration power generation device 10, the oscillation of the arm 12c was used to expand and compress the magnetostrictive plate 13 to generate electricity. As an alternative, a piezoelectric element may be provided instead of the magnetostrictive plate 13, and power may be generated by deforming the piezoelectric element using the oscillation of the arm 12c. Alternatively, a magnetic material may be provided instead of the magnetostrictive plate 13, and the arm 12c may be configured to move the magnetic material relative to the coil using the oscillation of the arm 12c to generate electricity by electromagnetic induction. The arm 12c of the vibration power generation device 10 itself may be made of a magnetostrictive material and the magnetostrictive plate 13 may be eliminated.

The vibration exciting body 11 of the vibration power generation device 10 is not limited to a columnar body with a circular or rectangular cross section, but may also be a columnar body with a polygonal cross section other than rectangular (a square/quadrangular).

In Experiments 1 to 4, the vibration experimental device 17 was attached to the wall surface 16 so that the bend of the U-shaped frame 19 was disposed downstream of the water flow, but the location of the bend is not limited. For example, in the vibration power generation device 10, the bend 12a of the frame 12 may be disposed upstream of the fluid from the vibration exciting body 11.

In a preferred embodiment of the present invention, as illustrated in FIGS. 1A to 1C, the arm 12c of the frame 12 is disposed parallel or substantially parallel to the wall surface 26, but the arm 12c does not have to be disposed parallel or substantially parallel to the wall surface 26 as long as the vibration exciting body 11 is disposed in proximity to the wall surface 26 and the arm 12c is oscillatable. Similarly, the arm 12c does not have to be disposed parallel or substantially parallel to the direction of the fluid flow.

The applications of the vibration power generation device 10 are described below.

Figure 7A:
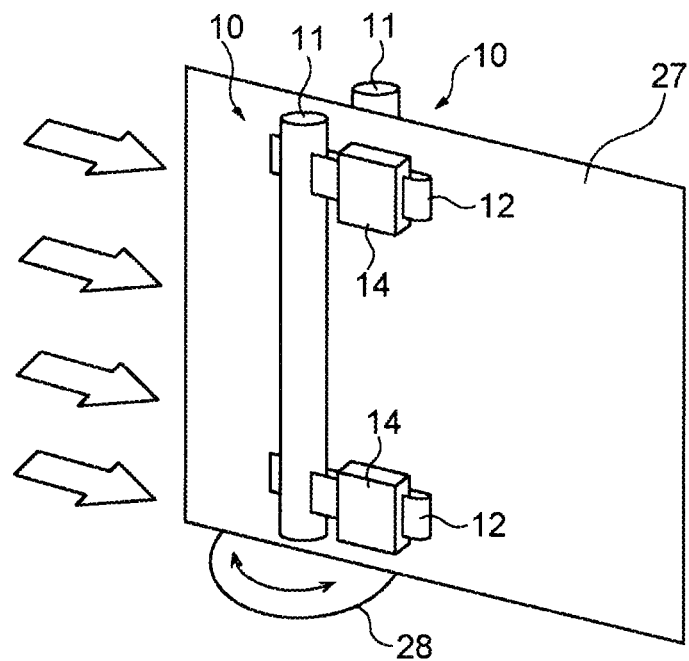
FIGS. 7A and 7B illustrate a wind following plate with the vibration power generation device applied thereto.
Figure 7B:
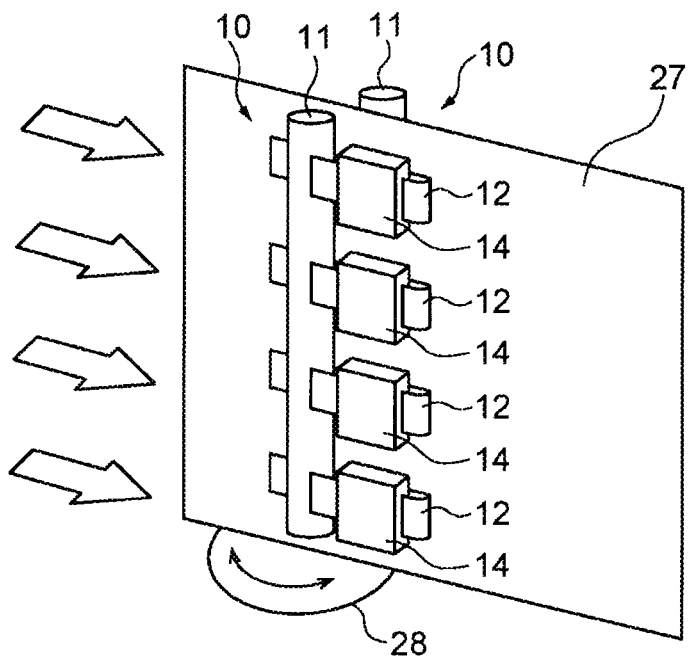

FIGS. 7A and 7B illustrate a wind following plate 27 with the vibration power generation device 10 applied thereto. In FIG. 7A, the wind following plate 27 extends vertically from a disk-shaped base 28 and is rotatable around the central axis of the base 28. The axis of rotation of the wind following plate 27 is offset from the center of the wind following plate 27. Therefore, when the wind following plate 27 is disposed in a fluid flow, for example, an air flow, the wind following plate 27 changes its orientation so that its surface is parallel or substantially parallel to the direction of the air flow (see the white arrows in the figure). That is, the wind following plate 27 changes its direction following the air flow. On each of the two sides of the wind following plate 27, the vibration power generation device 10 is disposed so that the longitudinal direction of the vibration exciting body 11 is perpendicular or substantially perpendicular to the air flow, the vibration exciting body 11 is parallel or substantially parallel to the surface of the wind following plate 27, and the longitudinal direction of each of the frames 12 is parallel or substantially parallel to the air flow.

Since the wind following plate 27 follows the air flow, the probability of air flow on the surface of the wind following plate 27 is increased. This increases the frequency at which the vibration exciting body 11 of the vibration power generation device 10 vibrates, thus further improving the power generation efficiency by the vibration power generation device 10.

Each of the number of the frames 12 and the number of the coils 14 that each vibration power generation device 10 includes is not limited to two, each vibration power generation device 10 may have three or more frames 12 and coils 14, as shown in FIG. 7B. In FIGS. 7A and 7B, the magnetostrictive plate 13 is not illustrated.

Figure 8:
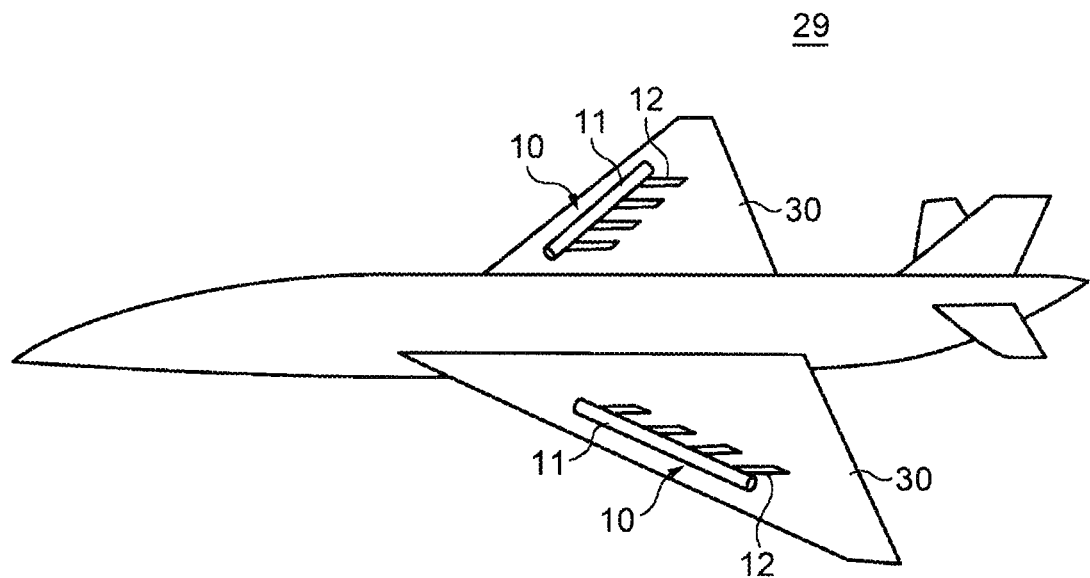
FIG. 8 illustrates an aircraft to which the vibration power generation device is applied.

FIG. 8 illustrates an aircraft 29 to which the vibration power generation device 10 is applied. In FIG. 8, the vibration power generation device 10 is disposed on the surface of each main wing 30 of the aircraft 29. In FIG. 8, the magnetostrictive plate 13 and the coil 14 are not illustrated.

In the aircraft 29, the vibration exciting body 11 is disposed near the leading edge of each of the main wings 30 so that its longitudinal direction is along the leading edge of the main wings 30. The vibration power generation device 10 is disposed on each of the main wings 30 so that the vibration exciting body 11 is parallel or substantially parallel to the surface of the main wing 30, and the longitudinal direction of each of the frames 12 is parallel or substantially parallel to the air flow. During the flight of the aircraft 29, there is a constant air flow on the surfaces of the main wings 30, which allows the vibration exciting body 11 to vibrate constantly, thus further improving the power generation efficiency of the vibration power generation device 10. Since the long vibration exciting body 11 is disposed near the leading edge of each of the main wings 30, the vibration exciting body 11 also functions as a vortex generator to reduce atmospheric drag. The location of the vibration power generation device 10 is not limited to the surface of the main wings 30. The vibration power generation device 10 may be disposed on any surface of the aircraft 29 as long as the location does not interfere with flight or takeoff/landing.

Figure 9:
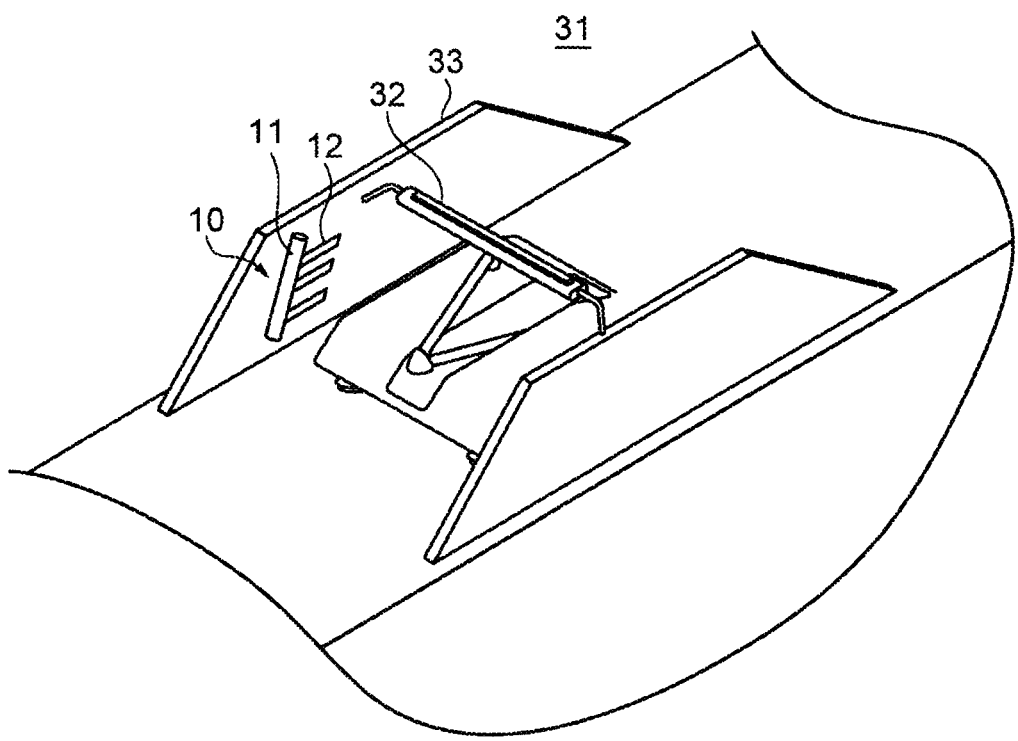
FIG. 9 illustrates a portion of a train to which the vibration power generation device is applied.

FIG. 9 illustrates a portion of a train 31 to which the vibration power generation device 10 is applied. In FIG. 9, the vibration power generation device 10 is disposed on the surface of a sound insulation plate 33 that insulates the wind noise of a pantograph 32 of the train 31. In FIG. 9, the magnetostrictive plate 13 and the coil 14 are not illustrated.

In the train 31, the vibration power generation device 10 is disposed on the sound insulation plate 33 so that the longitudinal direction of the vibration exciting body 11 is perpendicular or substantially perpendicular to the air flow generated while the train 31 is running, the vibration exciting body 11 is parallel or substantially parallel to the surface of the sound insulation plate 33, and the longitudinal direction of each of the frames 12 is parallel or substantially parallel to the above air flow. There is a constant air flow on the surface of the sound insulation plate 33 while the train 31 is running, which allows the vibration exciting body 11 to vibrate constantly, thus further improving the power generation efficiency of the vibration power generation device 10. The location of the vibration power generation device 10 is not limited to the surface of the sound insulation plate 33. The vibration power generation device 10 may be disposed anywhere on the train 31 vehicle surfaces as long as the location does not interfere with the running of the train 31.

Figure 10:
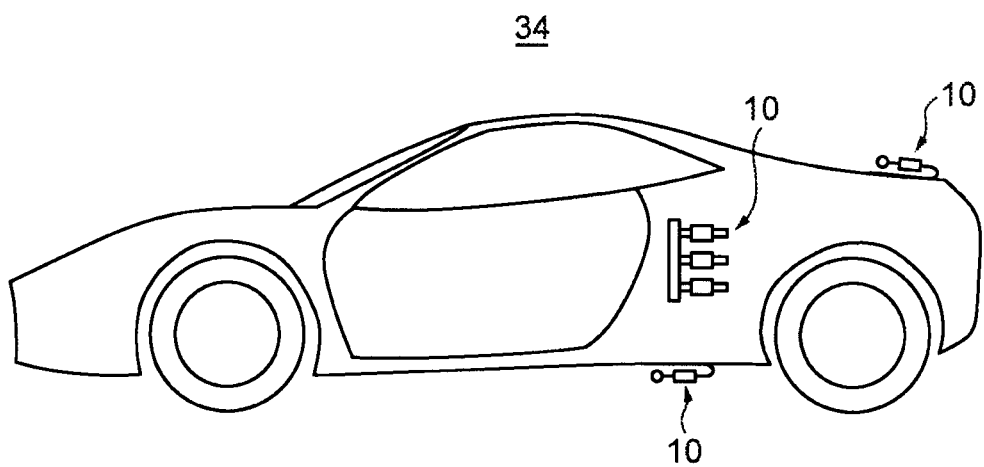
FIG. 10 illustrates an automobile to which the vibration power generation device is applied.

FIG. 10 illustrates an automobile 34 to which the vibration power generation device 10 is applied. In FIG. 10, the vibration power generation device 10 is disposed on the surface of the automobile 34. In FIG. 10, the magnetostrictive plate 13 is not illustrated. The reference signs for the vibration exciting body 11, the frame 12, and the coil 14 are also omitted.

In the automobile 34, the vibration power generation device 10 is disposed on the surface of the vehicle so that the longitudinal direction of the vibration exciting body 11 is perpendicular or substantially perpendicular to the air flow generated while the automobile 34 is running, the vibration exciting body 11 is parallel or substantially parallel to the vehicle surface, and the longitudinal direction of each of the frames 12 is parallel or substantially parallel to the air flow. There is a constant air flow on the surface of the vehicle while the automobile 34 is running, which allows the vibration exciting body 11 to constantly vibrate, thus further improving the power generation efficiency of the vibration power generation device 10. The automobile 34 is not limited to a four-wheeled vehicle as illustrated in FIG. 10, but may also be a three-wheeled vehicle or other multi-wheeled vehicle.

Figure 11:
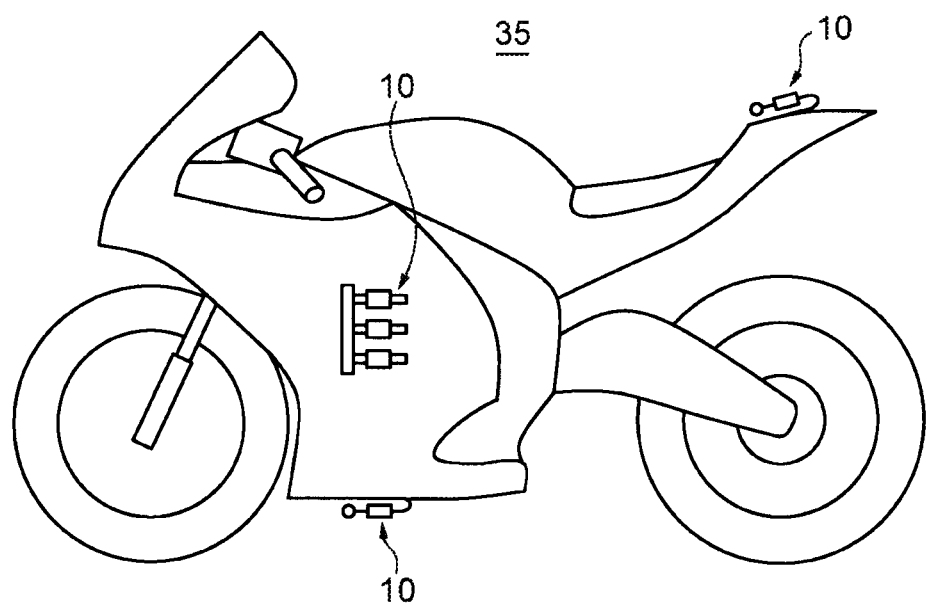
FIG. 11 illustrates a motorcycle as a saddle-riding vehicle to which the vibration power generation device is applied.

FIG. 11 illustrates a motorcycle 35 as a saddle-riding vehicle to which the vibration power generation device 10 is applied. In FIG. 11, the vibration power generation device 10 is disposed on the surface of the motorcycle 35. In FIG. 11, the magnetostrictive plate 13 is not illustrated. The reference signs for the vibration exciting body 11, the frame 12, and the coil 14 are also omitted.

In the motorcycle 35, the vibration power generation device 10 is disposed on the surface of the vehicle so that the longitudinal direction of the vibration exciting body 11 is perpendicular or substantially perpendicular to the air flow generated while the motorcycle 35 is running, the vibration exciting body 11 is parallel or substantially parallel to the vehicle surface, and the longitudinal direction of each of the frames 12 is parallel or substantially parallel to the air flow. There is a constant air flow on the surface of the vehicle while the motorcycle 35 is running, which allows the vibration exciting body 11 to constantly vibrate, thus further improving the power generation efficiency of the vibration power generation device 10. The saddle-riding vehicle to which the vibration power generation device 10 is applied is not limited to the motorcycle 35 illustrated in FIG. 11, but may also be a three-wheeled vehicle or an all-terrain vehicle (ATV).

Figure 12:
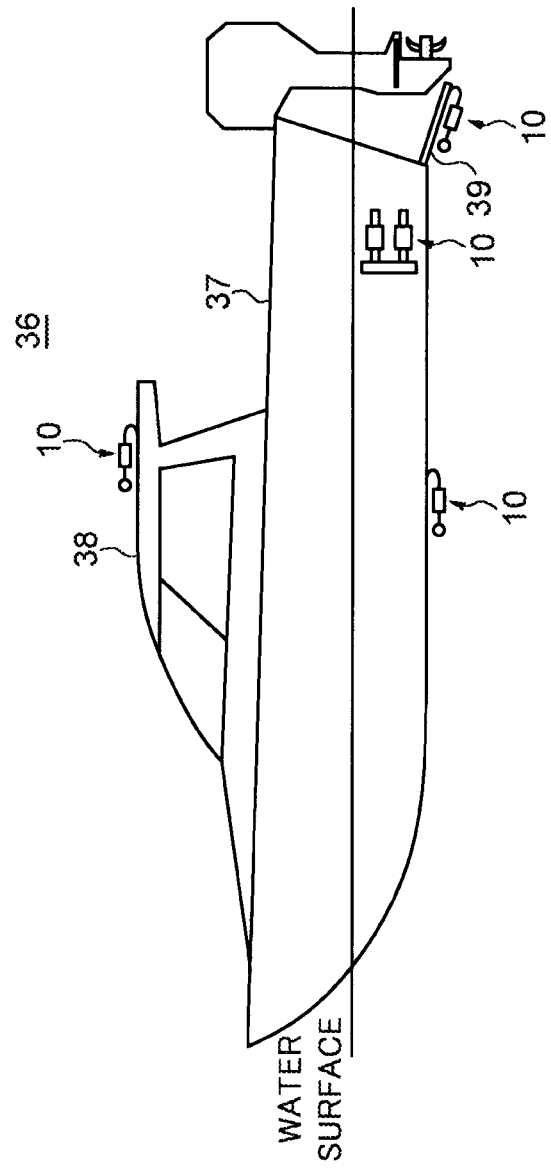
FIG. 12 illustrates a marine vessel to which the vibration power generation device is applied.

FIG. 12 illustrates a marine vessel 36 to which the vibration power generation device 10 is applied. In FIG. 12, the vibration power generation device 10 is disposed on the surface of a hull 37 or a cabin 38 of the marine vessel 36. In FIG. 12, the magnetostrictive plate 13 is not illustrated. The reference signs for the vibration exciting body 11, the frame 12, and the coil 14 are also omitted.

In the marine vessel 36, the vibration power generation device 10 is disposed on the surface of the hull 37 or the cabin 38 so that the longitudinal direction of the vibration exciting body 11 is perpendicular or substantially perpendicular to the flow of air or water generated while the marine vessel 36 is traveling, the vibration exciting body 11 is parallel or substantially parallel to the surface of the hull 37 or cabin 38, and the longitudinal direction of each of the frames 12 is parallel or substantially parallel to the flow of air or water. There is a constant flow of air or water on the surface of the hull 37 and the cabin 38 while the marine vessel 36 is traveling, which allows the vibration exciting body 11 to vibrate constantly, thus further improving the power generation efficiency of the vibration power generation device 10. In particular, when the vibration power generation device 10 is disposed on the surface of the hull 37 below the water surface, the fluid acting on the vibration exciting body 11 is water. In this case, since the water has a higher density than air, the variation in the pressure on the vibration exciting body 11 is greater, which allows the vibration exciting body 11 to vibrate more efficiently, resulting in further improvement of the power generation efficiency of the vibration power generation device 10. The location of the vibration power generation device 10 is not limited to the surface of the hull 37 or the cabin 38. The vibration power generation device 10 may be disposed on the surface of a trim tab 39 for posture control.

Figure 13A:
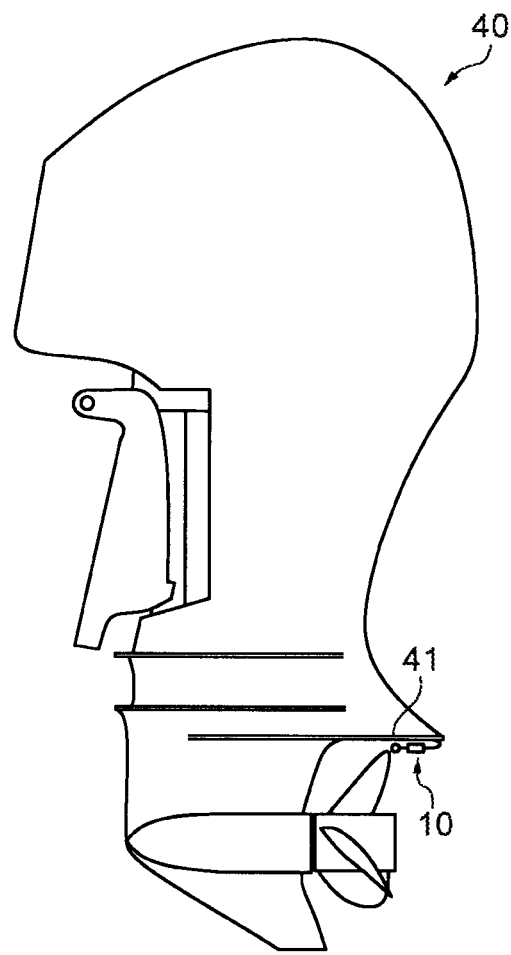
FIGS. 13A and 13B illustrate an outboard motor to which the vibration power generation device is applied.
Figure 13B:
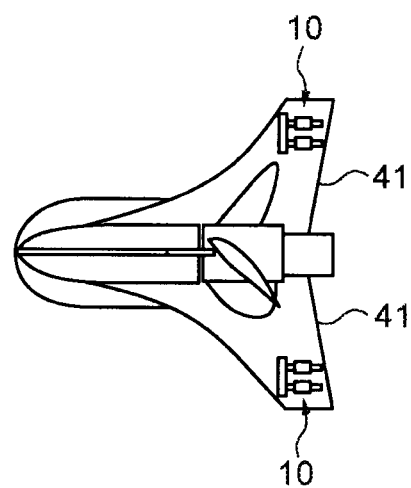

FIGS. 13A and 13B illustrate an outboard motor 40 to which the vibration power generation device 10 is applied. FIG. 13A is a side view of the outboard motor 40 and FIG. 13B is a bottom view of the outboard motor 40. In FIGS. 13A and 13B, the vibration power generation device 10 is disposed on the lower surface of an anti-ventilation plate 41 of the outboard motor 40. In FIGS. 13A and 13B, the magnetostrictive plate 13 is not illustrated. The reference signs for the vibration exciting body 11, the frame 12, and the coil 14 are also omitted.

In the outboard motor 40, the vibration power generation device 10 is disposed on the lower surface of the anti-ventilation plate 41 so that the longitudinal direction of the vibration exciting body 11 is perpendicular or substantially perpendicular to the water flow generated while the marine vessel equipped with the outboard motor 40 is traveling, the vibration exciting body 11 is parallel or substantially parallel to the lower surface of the anti-ventilation plate 41, and the longitudinal direction of each of the frames 12 is parallel or substantially parallel to the water flow. There is a constant water flow on the lower surface of the anti-ventilation plate 41 while the marine vessel equipped with the outboard motor 40 is traveling, which allows the vibration exciting body 11 to vibrate constantly, thus further improving the power generation efficiency of the vibration power generation device 10.

Figure 14:
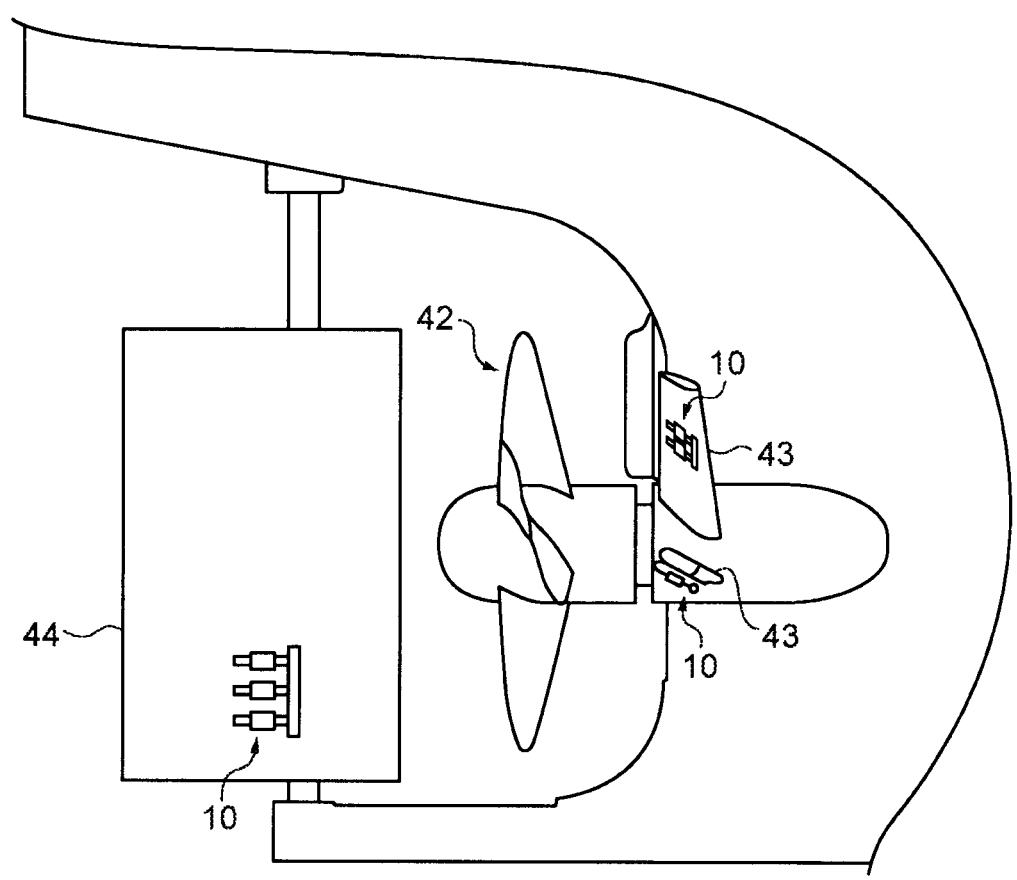
FIG. 14 illustrates a portion of a marine vessel to which the vibration power generation device is applied.

FIG. 14 illustrates a portion of a marine vessel to which the vibration power generation device 10 is applied. In FIG. 14, the vibration power generation device 10 is disposed upstream of a propeller 42 that generates a propulsive force. Specifically, the vibration power generation device 10 is disposed on the surface of each of a plurality of stators 43, which are fin-shaped members that control the water flow into the propeller 42 to reduce the rotational flow by the propeller 42. In FIG. 14, the magnetostrictive plate 13 is not illustrated. The reference signs for the vibration exciting body 11, the frame 12, and the coil 14 are also omitted.

In the marine vessel of FIG. 14, the vibration power generation device 10 is disposed on the surface of each of the stators 43 so that the longitudinal direction of the vibration exciting body 11 is perpendicular or substantially perpendicular to the water flow generated while the marine vessel is traveling, the vibration exciting body 11 is parallel or substantially parallel to the surface of each of the stators 43, and the longitudinal direction of each of the frames 12 is parallel or substantially parallel to the water flow. There is a constant water flow on the surface of each of the stators 43 while the marine vessel is traveling, which allows the vibration exciting body 11 to vibrate constantly, thus further improving the power generation efficiency of the vibration power generation device 10.

Figure 15A:
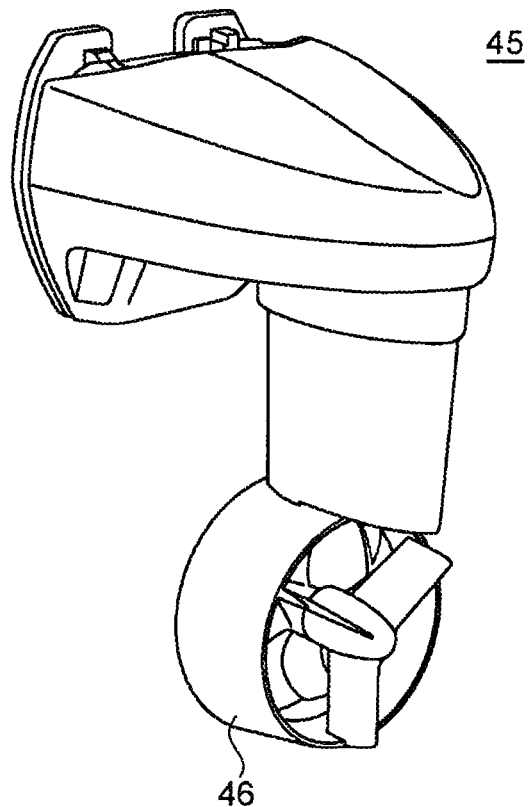
FIGS. 15A and 15B illustrate a duct propeller mechanism of a marine vessel to which the vibration power generation device is applied.
Figure 15B:
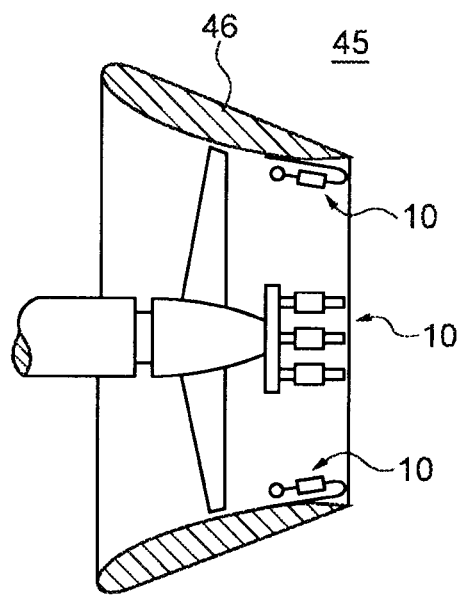

FIGS. 15A and 15B illustrate a duct propeller mechanism 45 of a marine vessel to which the vibration power generation device 10 is applied. FIG. 15A is a perspective view illustrating the duct propeller mechanism 45, and FIG. 15B is a cross-sectional view of the duct propeller mechanism 45. In FIGS. 15A and 15B, the vibration power generation device 10 is disposed on the inner surface of a duct 46 of the duct propeller mechanism 45. In FIGS. 15A and 15B, the magnetostrictive plate 13 is not illustrated. The reference signs for the vibration exciting body 11, the frame 12, and the coil 14 are also omitted.

In the duct propeller mechanism 45, the vibration power generation device 10 is disposed on the inner surface of the duct 46 so that the longitudinal direction of the vibration exciting body 11 is perpendicular or substantially perpendicular to the water flow through the inside of the duct 46, the vibration exciting body 11 is parallel or substantially parallel to the inner surface of the duct 46, and the longitudinal direction of each of the frames 12 is parallel or substantially parallel to the water flow. There is a constant water flow on the inner surface of the duct 46 while the marine vessel is traveling, which allows the vibration exciting body 11 to vibrate constantly, thus further improving the power generation efficiency of the vibration power generation device 10.

Applications of the vibration power generation device 10 are not limited to those described above. For example, the vibration power generation device 10 may be installed on the surface of a dam or dike through which water flows, or on the inner surface of a water intake pipe, water conduit, or water pipe. The vibration power generation device 10 may be installed on the surface of a high-rise building or tower that is exposed to the wind and where air flow is constantly present.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A vibration power generation device comprising:
   a vibration exciting body in which vibration is caused by a flowing fluid;
   a vibrated body that is oscillatable and connected to the vibration exciting body; and
   a power generator to generate electricity by oscillation of the vibrated body; wherein
   the vibration exciting body is located in proximity to a wall surface, and vibration is caused in the vibration exciting body by a fluid flowing along the wall surface; and
   a length L of the vibration exciting body in a direction parallel to the wall surface and perpendicular to a direction of the fluid flow is more than 3 times a length H of the vibration exciting body in a direction perpendicular to the wall surface.

2. The vibration power generation device according to claim 1, wherein, when a distance defining a gap between the wall surface and the vibration exciting body is S, a gap spacing ratio satisfies $1 \leq S/H \leq 3$.

3. The vibration power generation device according to claim 1, wherein a cross-section of the vibration exciting body parallel to a direction of the fluid flow and perpendicular to the wall surface is circular.

4. The vibration power generation device according to claim 3, wherein, when a flow velocity of the fluid to the wall surface is U and a natural frequency of a vibration system including the vibration exciting body and the vibrated body is fc, a reduced velocity of the fluid Vr expressed as $Vr=U/(fc \times H)$ is 4.0 or more.

5. The vibration power generation device according to claim 1, wherein a cross-section of the vibration exciting body parallel to the direction of the fluid flow and perpendicular to the wall surface is rectangular.

6. The vibration power generation device according to claim 5, wherein
   when a length of the vibration exciting body in a direction parallel to the direction of the fluid flow is D, an aspect ratio of the vibration exciting body satisfies $D/H \leq 1.0$; and
   when a flow velocity of the fluid with respect to the wall surface is U, and the natural frequency of the vibration system including the vibration exciting body and the vibrated body is fc, a reduced velocity of the fluid Vr expressed as $Vr=U/(fc \times H)$ is 2.0 or more.

7. The vibration power generation device according to claim 6, wherein the aspect ratio D/H is 0.2, and the reduced velocity of the fluid Vr is 2.0 or more.

8. The vibration power generation device according to claim 6, wherein the aspect ratio D/H is 0.5, and the reduced velocity of the fluid Vr is 3.0 or more.

9. The vibration power generation device according to claim 6, wherein the aspect ratio D/H is 1.0, and the reduced velocity of the fluid Vr is 4.0 or more.

10. The vibration power generation device according to claim 1, wherein the vibrated body is attached to the wall surface and the wall surface does not vibrate.

11. The vibration power generation device according to claim 1, wherein the power generator includes a magnetostrictive material that repeatedly expands and compresses in response to the oscillation of the vibrated body, and a coil wound around the magnetostrictive material.

12. The vibration power generation device according to claim 1, wherein
    a plurality of the vibrated bodies are connected to the vibration exciting body, and the power generator is attached to each of the plurality of vibrated bodies.

13. The vibration power generation device according to claim 1, wherein
    the vibration exciting body is attached to the wall surface; and
    the wall surface is a surface of a fluid following plate that follows the fluid flow and changes a direction thereof in response to the fluid flow.

14. A moving object comprising:
    a surface in contact with a fluid; and
    a vibration power generation device located on the surface and including:
      a vibration exciting body in which vibration is caused by the fluid;
      a vibrated body that is oscillatable and connected to the vibration exciting body; and
      a power generator to generate electricity by oscillation of the vibrated body; wherein
    the vibration exciting body is located in proximity to the surface, and vibration is caused in the vibration exciting body by the fluid flowing along the surface; and
    a length L of the vibration exciting body in a direction parallel to the surface and perpendicular to a direction of the fluid flow is more than 3 times a length H of the vibration exciting body in a direction perpendicular to the surface.

15. The moving object according to claim 14, wherein, when a distance defining a gap between the surface and the vibration exciting body is S, a gap spacing ratio satisfies $1 \leq S/H \leq 3$.

16. The moving object according to claim 14, wherein the moving object is a marine vessel, and the surface on which the vibration power generation device is located is a surface of a hull of the marine vessel.

17. The moving object according to claim 16, wherein the surface on which the vibration power generation device is located is a surface of the hull below a water surface.

18. The moving object according to claim 17, wherein the moving object is a marine vessel, and the surface below the water surface is a surface of a fin-shaped portion of the hull.

19. The moving object according to claim 14, wherein the moving object is a marine vessel, and the surface on which the vibration power generation device is located is a surface of a trim tab attached to the hull of the marine vessel.

20. The moving object according to claim 14, wherein the moving object is a marine vessel, and the surface on which the vibration power generation device is located is a surface of an anti-ventilation plate of an outboard motor attached to the hull of the marine vessel.

21. The moving object according to claim 14, wherein the moving object is a marine vessel, and the surface on which the vibration power generation device is located is a surface of a duct in a duct propeller mechanism of the marine vessel.

22. The moving object according to claim 14, wherein the moving object is an aircraft, and the surface on which the vibration power generation device is located is a surface of the aircraft.

23. The moving object according to claim 14, wherein the moving object is a train, and the surface on which the vibration power generation device is located is a surface of a car of the train.

24. The moving object according to claim 14, wherein the moving object is a saddle-riding vehicle, and the surface on which the vibration power generation device is located is a surface of the saddle-riding vehicle.

25. The moving object according to claim 14, wherein the moving object is an automobile, and the surface on which the vibration power generation device is located is a surface of the automobile.

* * * * *